US012793763B2

(12) United States Patent
Wang et al.

(10) Patent No.: US 12,793,763 B2
(45) Date of Patent: Nov. 10, 2026

(54) TIMING CONTROL CIRCUIT AND METHOD FOR ASYNCHRONOUS TIME DOMAIN TO SYNCHRONOUS TIME DOMAIN TRANSFER AND RELATED MEMORY MODULE THEREOF

(71) Applicant: PieceMakers Technology, Inc., Hsinchu City (TW)

(72) Inventors: Ming-Hung Wang, Hsinchu City (TW); Shi-Huei Liu, Hsinchu City (TW); Chun-Kai Wang, Hsinchu City (TW)

(73) Assignee: PieceMakers Technology, Inc., Hsinchu City (TW)

( * ) Notice: Subject to any disclaimer, the term of this patent is extended or adjusted under 35 U.S.C. 154(b) by 116 days.

(21) Appl. No.: 18/969,273

(22) Filed: Dec. 5, 2024

(65) Prior Publication Data

US 2025/0191641 A1 Jun. 12, 2025

Related U.S. Application Data

(60) Provisional application No. 63/607,063, filed on Dec. 6, 2023.

(51) Int. Cl.
*G11C 11/4076* (2006.01)
*G11C 11/4096* (2006.01)

(52) U.S. Cl.
CPC ...... *G11C 11/4076* (2013.01); *G11C 11/4096* (2013.01)

(58) Field of Classification Search
CPC ........... G11C 11/4076; G11C 11/4096; G11C 7/1072; G11C 7/222; G06F 13/1689
See application file for complete search history.

(56) References Cited

U.S. PATENT DOCUMENTS 8,988,952 B2 3/2015 Hiraishi
2013/0268722 A1* 10/2013 Kim .................... G11C 11/1653 711/103
2015/0049854 A1* 2/2015 Song ...................... G11C 19/28 377/70
2015/0131391 A1 5/2015 Hsu
(Continued)

FOREIGN PATENT DOCUMENTS

TW I722869 B 3/2021

*Primary Examiner* — Amir Zarabian
*Assistant Examiner* — Justin Bryce Heisterkamp
(74) *Attorney, Agent, or Firm* — Winston Hsu

(57) ABSTRACT

A timing control circuit for use in a memory module includes: a clock generation circuit and a data queue. The clock generation circuit is configured to generate one or more delayed versions of an external clock signal and select one of the external clock signal and the one or more delayed versions of the external clock signal to generate a tracking clock signal according to a write latency count satisfaction indication signal and a row-to-column delay end indication signal. The data queue is configured to queue input data according to the external clock signal and generate an output data signal by de-queuing the queue data according to the tracking clock signal. Specifically, the output data signal and the tracking clock signal are utilized to perform a write operation within the memory module in response to an external write command.

21 Claims, 8 Drawing Sheets

(56) References Cited

U.S. PATENT DOCUMENTS

| | | | | |
|---|---|---|---|---|
| 2015/0287451 | A1* | 10/2015 | Lee | G11C 11/4093 365/189.05 |
| 2017/0140808 | A1 | 5/2017 | Jung | |
| 2020/0027498 | A1* | 1/2020 | Jeon | H03K 19/0005 |
| 2020/0143855 | A1* | 5/2020 | Kim | G11C 7/1096 |
| 2020/0279588 | A1* | 9/2020 | Lym | G11C 29/12 |
| 2022/0208255 | A1* | 6/2022 | Mori | G11C 7/1093 |
| 2023/0395125 | A1* | 12/2023 | Pohlmann | G06F 1/04 |
| 2024/0127881 | A1* | 4/2024 | Huang | G06F 1/08 |

* cited by examiner

TIMING CONTROL CIRCUIT AND METHOD FOR ASYNCHRONOUS TIME DOMAIN TO SYNCHRONOUS TIME DOMAIN TRANSFER AND RELATED MEMORY MODULE THEREOF

CROSS REFERENCE TO RELATED APPLICATIONS

This application claims the benefit of U.S. Provisional Application No. 63/607,063, filed on Dec. 6, 2023. The content of the application is incorporated herein by reference.

BACKGROUND OF THE INVENTION

1. Field of the Invention

The present invention relates to memory devices, and more particularly, to a timing control circuit and method for use in a synchronous memory module accessible through an asynchronous interface and related memory module.

2. Description of the Prior Art

Memory devices play a pivotal role in computer systems, serving as the cornerstone for storing and retrieving data that processors use to perform computations. The efficiency and performance of a computer system are significantly influenced by the ability of the memory devices to handle data transactions swiftly and reliably. Among various types of memory, dynamic random-access memory (DRAM) is extensively utilized due to its balance of speed and cost for a wide range of applications, from personal computing devices to sophisticated server systems.

Performance of a memory device is affected by its latency parameters, including CAS Latency (CL), row-to-column delay (tRCD), row pre-charge time (tRP) and row active time (tRAS), . . . , and so on. These latency parameters are essential metrics that define the responsiveness of a memory device to read and write requests. Hence, accessing high-speed memory effectively requires a precise timing control mechanism. Without accurate timing control, the data integrity might be compromised, leading to failed data transactions.

FIG. 1 illustrates a timing diagram of control signals for performing a write command on a synchronous (time domain) memory (e.g., dynamic random-access memory (DRAM)) module through an asynchronous (time domain) interface (e.g., a static random-access memory (SRAM) interface). As illustrated, a chip select signal CS # is set as active (which is active low) by an external memory controller to allow the DRAM module to be active for receiving command and address information. Accordingly, an internal control circuitry of the DRAM module receives an external clock signal CK provided by the external memory controller. At "0"th rising edge of the external clock signal CK, the external memory controller issues a write command to the internal control circuitry of the DRAM module and therefore the internal control circuitry generates a row activate command to a memory cell array to activate one of a plurality of rows of the memory cell array associated with the write command. After a row-to-column delay tRCD has elapsed since the row activate command is issued, a row-to-column delay end indication signal TRCDED is set as active, which means columns of the memory cell array is ready for being accessed. In addition, after a write latency (cycle) count WLC has been satisfied (which is 5 clock cycles in the case), a write latency (cycle) count satisfaction indication signal WLCEN is set as active, which means the external memory controller is allowed to place data onto an external data bus DQ of the DRAM module. Therefore, upon 5th rising edge of the external clock signal CK, the internal control circuitry starts generating a tracking clock signal CK_TR, which is further used to generate column selection signals YS0-YS3 on a column selection signal bus YS<0: 1023> to activate columns of the memory cell array. In addition, the external memory controller starts placing data D0-D3 onto the external data bus DQ. Then, the internal control circuitry starts writing data D0-D3 through an internal data bus MDQ to the memory cell array according to the timing of the column selection signals YS0-YS3. Such operation can correctly write data D0-D3 to the DRAM module since an active state of the row-to-column delay end indication signal TRCDED is prior to the write latency count satisfaction indication signal WLCEN (i.e., a non-overlap condition).

However, things will be different if the active state of the row-to-column delay end indication signal TRCDED occurs after the write latency count satisfaction indication signal WLCEN (i.e., an overlap condition). Please refer to FIG. 2 for a more detailed understanding. As illustrated, before the chip select signal CS # is de-asserted by the external memory controller, rendering the DRAM module active for receiving command and address information, the DRAM module performs an internal self-refresh operation for data retention. Then, the external memory controller issues a write command to the internal control circuitry of the DRAM module at "0"th rising edge of the external clock signal CK. However, as the internal self-refresh operation is being performed, the row activate command can only be issued after the self-refresh period tRFC has elapsed, indicating that the memory cell array will be ready for access after the 6th rising edge of the external clock signal CK. On the other hand, as the internal self-refresh operation is transparent to the external memory controller, the external memory controller still begins to place data D0-D3 onto the external data bus DQ at the 5th rising edge of the external clock signal CK. However, accurate writing to the memory cell array is only possible after the 6th rising edge of the external clock signal CK (due to the row-to-column delay trCD), which means any data placed on the external data bus bus DQ before the 7th rising edge of the external clock signal CK may not be accepted by the internal control circuitry. Meanwhile, the external memory controller ceases to provide the external clock signal CK to the internal control circuitry after the 8th rising edge of the external clock signal CK, preventing the internal control circuitry from generating all necessary column selection signals YS0-YS3 in time to facilitate writing the intended data D0-D3. In light of this, there emerges a need to provide a timing control mechanism to resolve the aforementioned issues.

SUMMARY OF THE INVENTION

With this in mind, it is one object of the present invention to provide a timing control circuit and a timing control method for performing asynchronous time domain to synchronous time domain transfer in a synchronous memory module that is accessible by an asynchronous interface. In the embodiments of the present invention, the timing control circuit internally generates a tracking clock signal whose timing is dynamically adjusted according to various latencies in the memory module and adjust the timing of data to be written according to the tracking clock signal, such that any accessing operation can be correctly performed, without being affected by the timing of the external clock signal.

According to one embodiment, a timing control circuit for use in a memory module is provided. The timing control circuit comprising: a clock generation circuit and a data queue. The clock generation circuit is configured to generate one or more delayed versions of an external clock signal and select one of the external clock signal and the one or more delayed versions of the external clock signal to generate a tracking clock signal according to a write latency count satisfaction indication signal and a row-to-column delay end indication signal. The data queue is coupled to the clock generation circuit and configured to queue input data according to the external clock signal and generate an output data signal by de-queuing the queued input data according to the tracking clock signal. Specifically, the output data signal and the tracking clock signal are utilized to perform a write operation within the memory module in response to an external write command.

According to one embodiment, a timing control method for use in a memory module is provided. The timing control method comprises: generating one or more delayed versions of an external clock signal; selecting one of the external clock signal and the one or more delayed versions of the external clock signal to generate a tracking clock signal according to a write latency count satisfaction indication signal and a row-to-column delay end indication signal; queuing input data according to the external clock signal; de-queuing the queued input data to generate an output data signal according to the tracking clock signal; and performing a write operation within the memory module in response to an external write command according to the output data signal and the tracking clock signal.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 1:
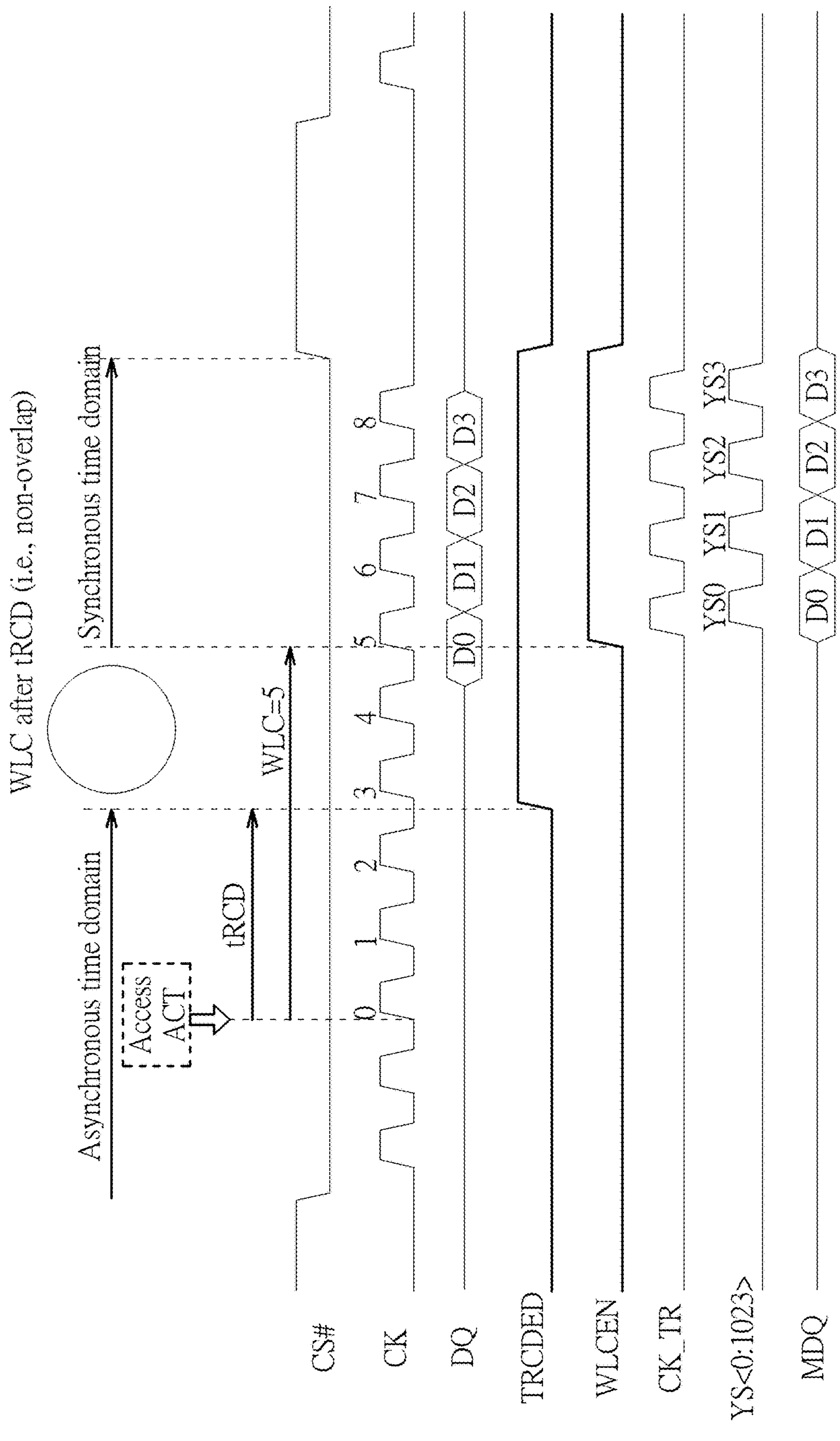
FIG. 1 (Prior Art)
FIG. 1 illustrates a timing diagram of control signals for performing a write command on a synchronous memory module through an asynchronous interface in a non-overlap condition.
Figure 2:
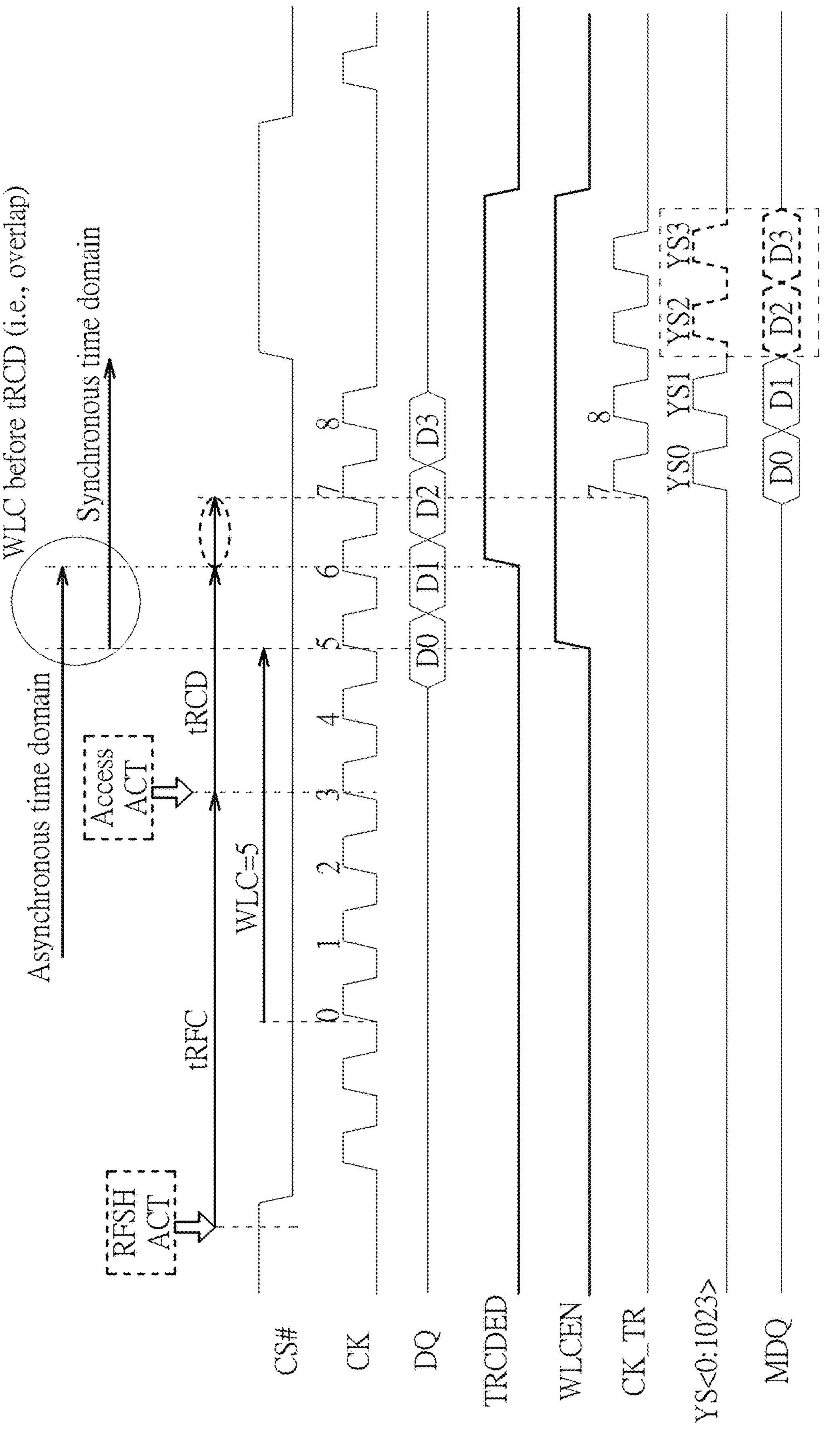
FIG. 2 (Prior Art)
FIG. 2 illustrates a timing diagram of control signals for performing a write command on a synchronous memory module through an asynchronous interface in an overlap condition.
Figure 3:
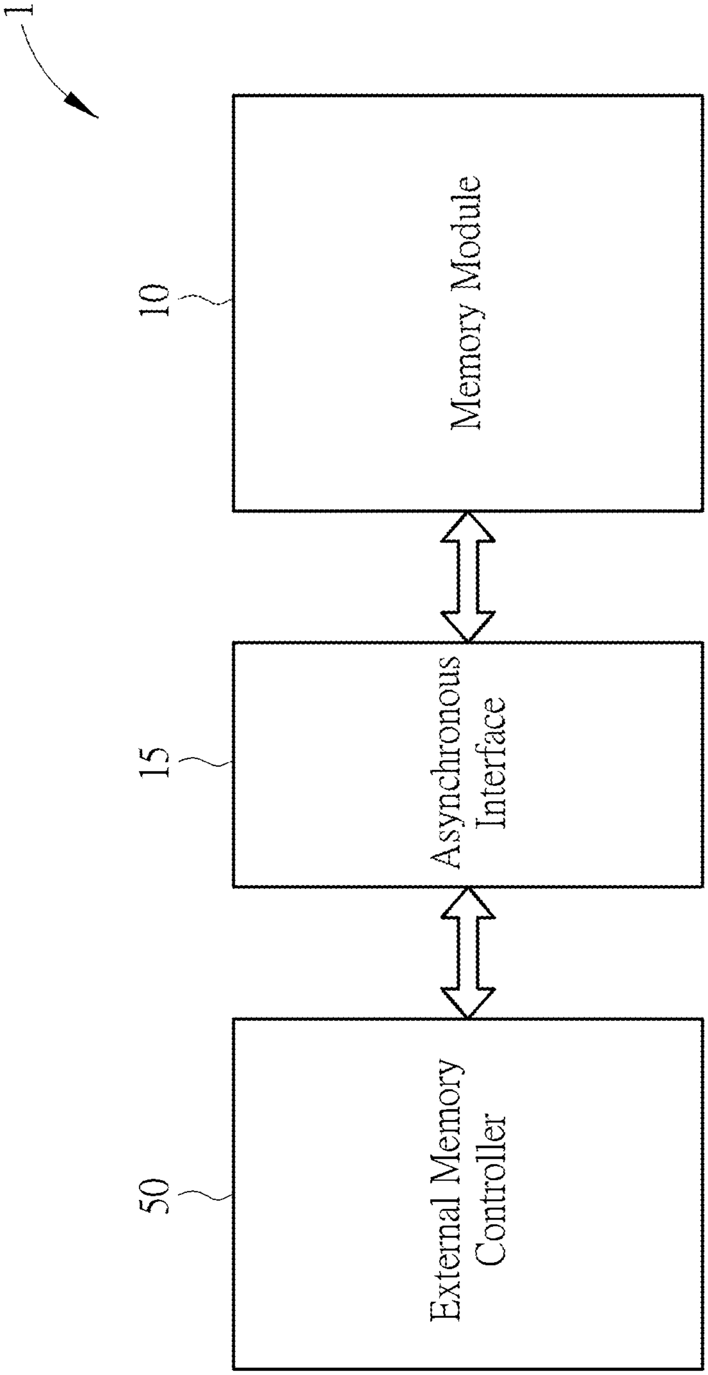
FIG. 3 illustrates a schematic diagram of a memory device according to one embodiment of the present invention.

FIG. 3 illustrates a schematic diagram of a memory device according to one embodiment of the present invention. As shown by FIG. 3, a memory device 1 comprises a memory module 10 and an external memory controller 50. In one embodiment, the memory module 10 can be a double data rate synchronous dynamic random-access memory (DDR SDRAM) module accessible through asynchronous interfaces. The external memory controller 50 communicates with the memory module 10 through an asynchronous interface 15, which may be an SRAM interface. When accessing the memory module 10, the external memory controller 50 may send various commands, control signals, clock signals and/or data to the memory module 10 through the asynchronous interface 15.

Figure 4:
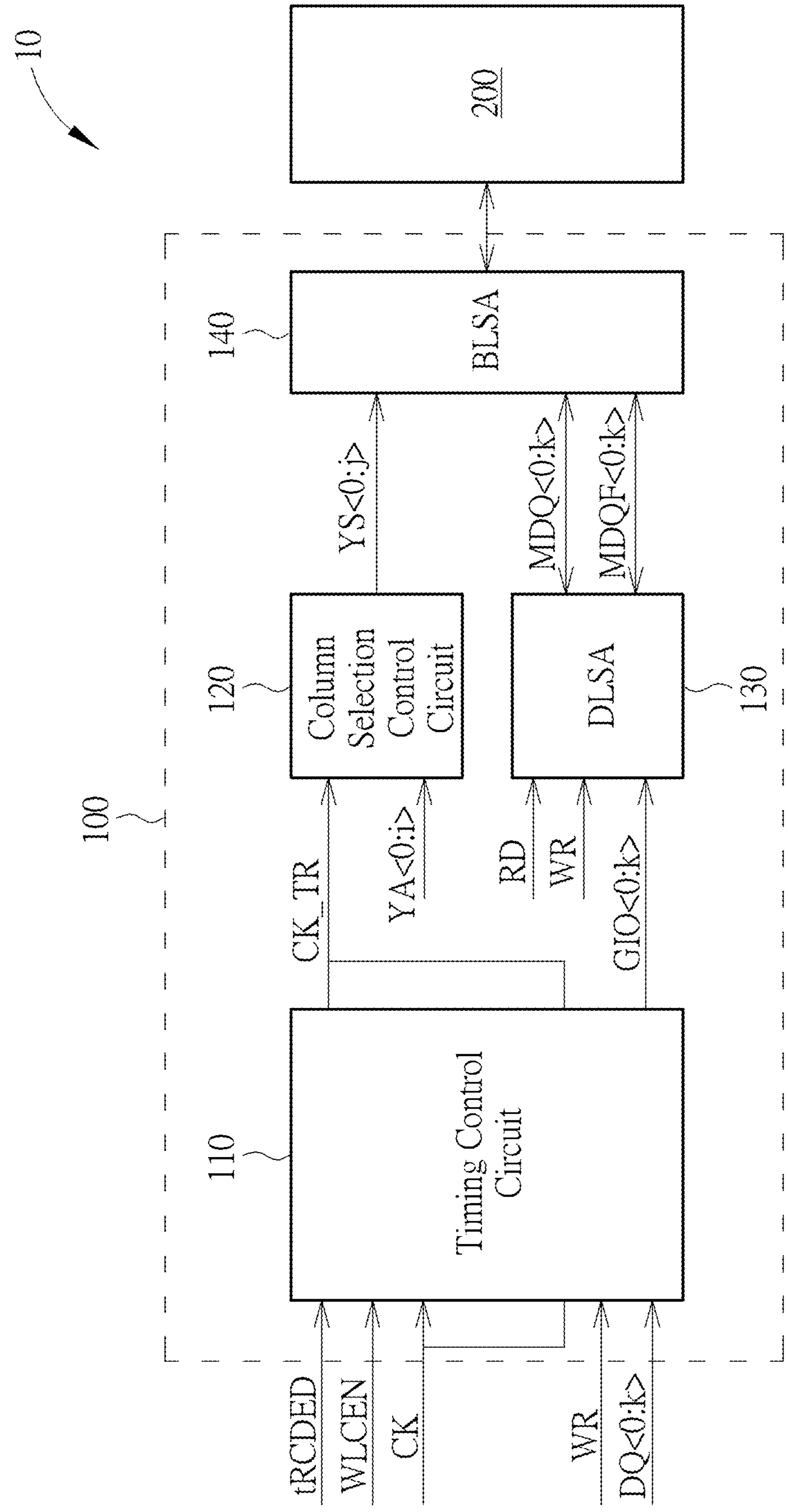
FIG. 4 illustrates a schematic diagram of a memory module according to one embodiment of the present invention.

FIG. 4 illustrates a schematic diagram of a memory module according to one embodiment of the present invention. The memory module 10 comprises an internal control circuitry 100 and a memory cell array 200. The internal control circuitry 100 is configured to control access to the memory cell array 200 in response to external access (read/write) commands issued by the external memory controller 50. The internal control circuitry 100 includes a timing control circuit 110, a column selection control circuit 120, a data line sense amplifier (DLSA) 130 and a bit line sense amplifier (BLSA) 140. In addition, the memory cell array 200 includes a plurality of memory cells that are two-dimensionally arranged, for example, may be arranged in the form of a matrix consisting of certain rows and columns.

The timing control circuit 110 is configured to generate a tracking clock signal CK_TR according to an external clock signal CK sent by the external memory controller 50 based on a row-to-column delay indication signal TRCDED and a write latency count satisfaction signal WLCEN. In addition, the timing control circuit 110 is further configured to queue input data on an external data bus DQ<0:k> based on the timing of the external clock signal CK. In addition, the timing control circuit 110 is also configured to dequeue the queued input data to provide at least one output data signal on an output data bus GIO<0:k> based on the timing of the tracking clock signal CK_TR.

The column selection control circuit 120 is configured to generate a plurality of column selection signals YS0-YSj on a column selection signal bus YS<0:j> by decoding an address signal on a column address bus YA<0:i> based on the timing of the tracking clock signal CK_TR, where each of the column selection signals YS0-YSj is aligned with a clock cycle of the tracking clock signal CK_TR. In addition, each of the column selection signals YS0-YSj is configured to activate one of a plurality of columns (i.e., (j+1) columns) of the memory cell array 200, such that a bit line and a corresponding complementary bit line of an activated one of the columns can be read or written.

The DLSA 130 is configured to receive the output data signal from the timing control circuit 110 through the output data bus GIO<0:k> and accordingly convert the output data signal to differential data signals onto internal data buses MDQ<0:k> and MDQF<0:k> when handling a write command (indicated by a signal line WR). Moreover, the DLSA 130 is further configured to receive differential data signals on the internal data buses MDQ<0:k> and MDQF<0:k> and accordingly convert and amplify the differential data signals to generate a single-ended data signal when handling a read command (indicated by a signal line RD). The BLSA 140 is configured to receive the differential data signals on the internal data buses MDQ<0:k> and MDQF<0:k>, amplify the differential data signals and apply appropriate voltage on specific bit lines and corresponding complementary bit lines of the memory cell array 200 when handling a write command. In addition, the BLSA 140 is also configured to sense voltages on specific bit lines and corresponding complementary bit lines of the memory cell array 200 and accordingly amplify the sensed voltages to generate the differential data signals onto the internal data buses MDQ<0:k> and MDQF<0:k> when handling the read command.

Figure 5:
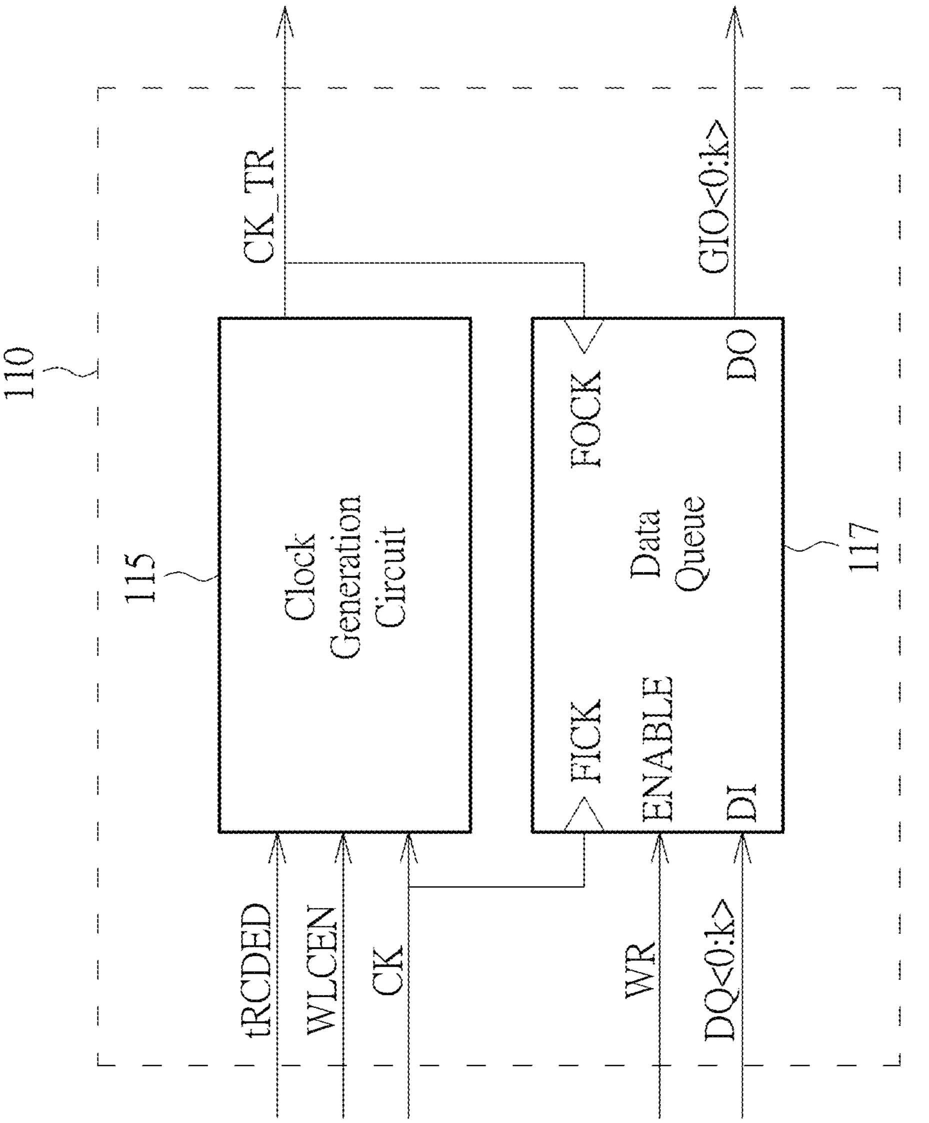
FIG. 5 illustrates a schematic diagram of a timing control circuit according to one embodiment of the present invention.

FIG. 5 illustrates a schematic diagram of a timing control circuit according to one embodiment of the present invention. As illustrated, the timing control circuit 110 includes a clock generation circuit 115. In one embodiment, the clock generation circuit 115 is configured to generate one or more delayed versions of the external clock signal CK and select one of the external clock signal CK and the one or more delayed versions of the external clock signal CK to generate a tracking clock signal CK_TR based on the row-to-column delay indication signal TRCDED and the write latency count satisfaction signal WLCEN. In one embodiment, the row-to-column delay indication signal TRCDED will be set active if a row-to-column delay tRCD has elapsed, meaning that the memory cell array 200 is ready for access in response to a row activate command. In one embodiment, the write latency count satisfaction signal WLCEN will be set active if the write latency (cycle) count WLC has been satisfied, meaning that internal control circuitry 100 is ready for receiving data on the external data bus DQ<0:k> and the external memory controller 50 is allowed to put data intended to be written onto the external data bus DQ<0:k>. In addition, the timing control circuit 110 further includes a data queue 117. The data queue 117 is configured to sample and queue input data on the external data bus DQ<0:k> at its input terminal DI according to the external clock signal CK at its clock input terminal FICK. In addition, according to the tracking clock signal CK_TR at its clock output terminal FOCK, the data queue 117 is configure to de-queue/output queued data as output data signals onto the output data bus GIO<0:k> through its data output terminal DO. In one embodiment, the data queue 117 could be a first-in, first-out (FIFO) queue.

Figure 6:
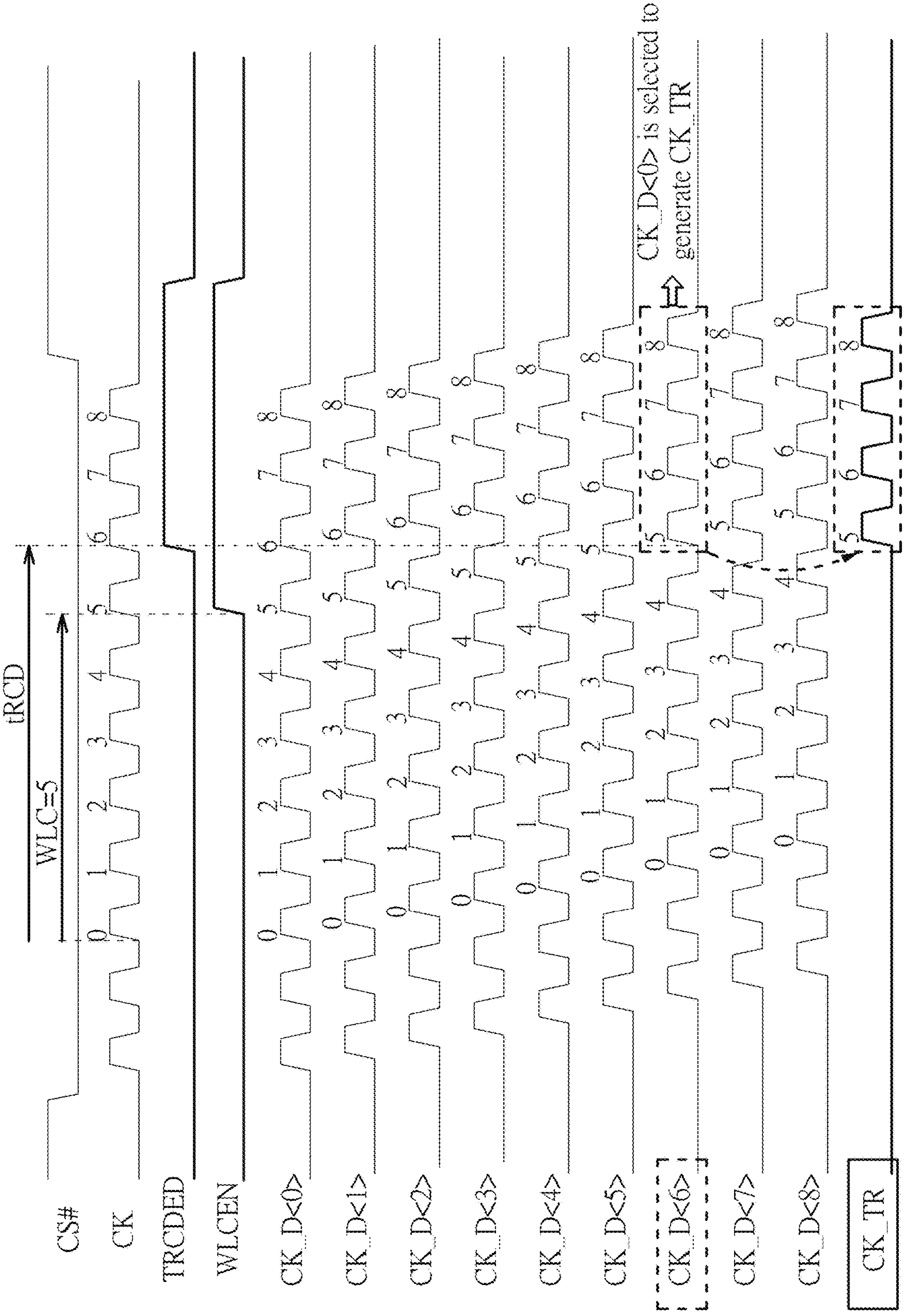
FIG. 6 illustrates how a clock generation circuit generates a tracking signal according to one embodiment of the present invention.

Please refer to FIG. 6, which illustrates how the clock generation circuit 115 generates the tracking signal CK_TR according to one embodiment of the present invention. When receiving the external clock signal CK from the external memory controller 50, the clock generation circuit 115 generates delayed versions CK_D<1>-CK_D<8> of the external clock signal CK by adding certain predetermined amounts of delays to the external clock signal CK. Please note that the above number of the delayed versions of the external clock signal CK is not indented to limit the present invention in scope. Moreover, the version CK_D<0> of the external clock signal CK is substantially the external clock signal CK without delay.

At first, the clock generation circuit 115 determines whether an active state of the write latency count satisfaction indication signal WLCEN is after an active state of the row-to-column delay end indication signal TRCDED. If yes, the clock generation circuit 115 selects the external clock signal CK (i.e., the delay-free version CK_D<0>) to generate the tracking clock signal CK_TR; otherwise, the clock generation circuit 115 selects one of the delayed versions CK_D<1>-CK_D<8> of the external clock signal CK to generate the tracking clock signal CK_TR.

In the process of selecting one of the delayed versions CK_D<1>-CK_D<8> of the external clock signal CK to generate the tracking clock signal CK_TR, the clock generation circuit 115 is firstly configured to compare timings of the active state of the row-to-column delay end indication signal TRCDED with each of the delayed versions CK_D<1>-CK_D<8> of the external clock signal CK. By doing so, the clock generation circuit 115 could determine which one of the delayed versions CK_D<1>-CK_D<8> of the external clock signal CK has a rising edge closet to (active) transition of the row-to-column delay end indication signal TRCDED than any other ones of the delayed versions CK_D<1>-CK_D<8> of the external clock signal CK.

In the case of FIG. 6, since the delayed version CK<6> of the external clock signal CK has a rising edge occurring immediately after the (active) transition of the row-to-column delay end indication signal TRCDED, compared to any other delayed versions of the external clock signal CK, the delayed version CK<6> of the external clock signal CK will be selected. Accordingly, the selected delayed version CK<6> of the external clock signal CK will be used to generate the tracking clock signal CK_TR. Specifically, the clock generation circuit 115 extracts 4 clock pulses of the selected delayed version CK<6> of the external clock signal CK, starting at a 5th clock pulse thereof (which is associated with a cycle number "5" of the write latency count WLC). Consequently, the extracted clock pulses (i.e., 5th, 6th, 7th and 8th clock pulses) of the selected delayed version CK<6> of the external clock signal CK will be the tracking clock signal CK_TR.

Figure 7:
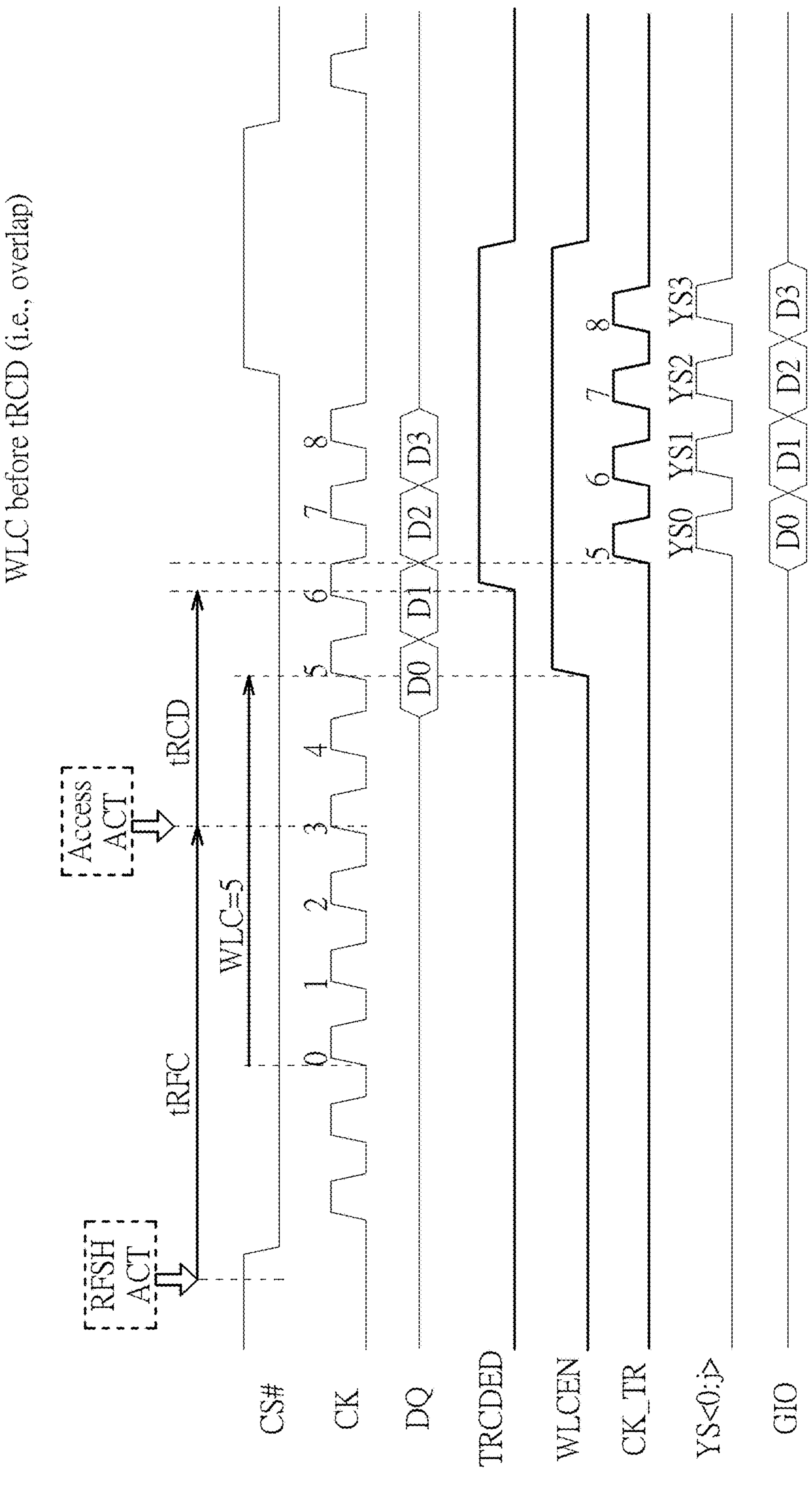
FIG. 7 illustrates a timing diagram of control signals for performing a write command on a synchronous memory module through an asynchronous interface in a non-overlap condition according to one embodiment of the present invention.

FIG. 7 illustrates a timing diagram of control signals for performing a write command on a synchronous memory module through an asynchronous interface in an overlap condition according to one embodiment of the present invention. As illustrated, before the chip select signal CS # is de-asserted by the external memory controller 50, rendering the memory module 10 active for receiving command and address information, the memory module 10 performs an internal self-refresh operation (labeled as "RESH ACT") for data retention. Then, the external memory controller 50 issues a write command to the internal control circuitry 100 of the memory module 10 at "0"th rising edge of the external clock signal CK. However, as the internal self-refresh operation is being performed, the row activate command can only be issued after the self-refresh period tRFC has elapsed (labeled as "ACCESS ACT"). This means that the memory cell array 200 will be ready for access after the 6th rising edge of the external clock signal CK (due to the row-to-column delay tRCD). In addition, the external memory controller 50 ceases to provide the external clock signal CK to the internal control circuitry 100 after the 8th rising edge of the external clock signal CK.

With this regards, the timing control circuit 110 selects a delayed version of the external clock signal CK (according to the active transition of row-to-column delay end indication signal TRCDED) and accordingly generates the tracking clock signal CK_TR (according to the cycle number of the write latency count). Thus, all necessary column selection signals YS0-YS3 can be properly generated even if the external memory controller 50 ceases to provide the external clock signal CK. Moreover, data signals on the data bus GIO is provided from the data queue 117 according to the timing of the tracking clock signal CK_TR, which will perfectly be aligned with the column selection signals YS0-YS3. As such, the data D0-D3 can be properly written to the memory cell array 200.

Figure 8:
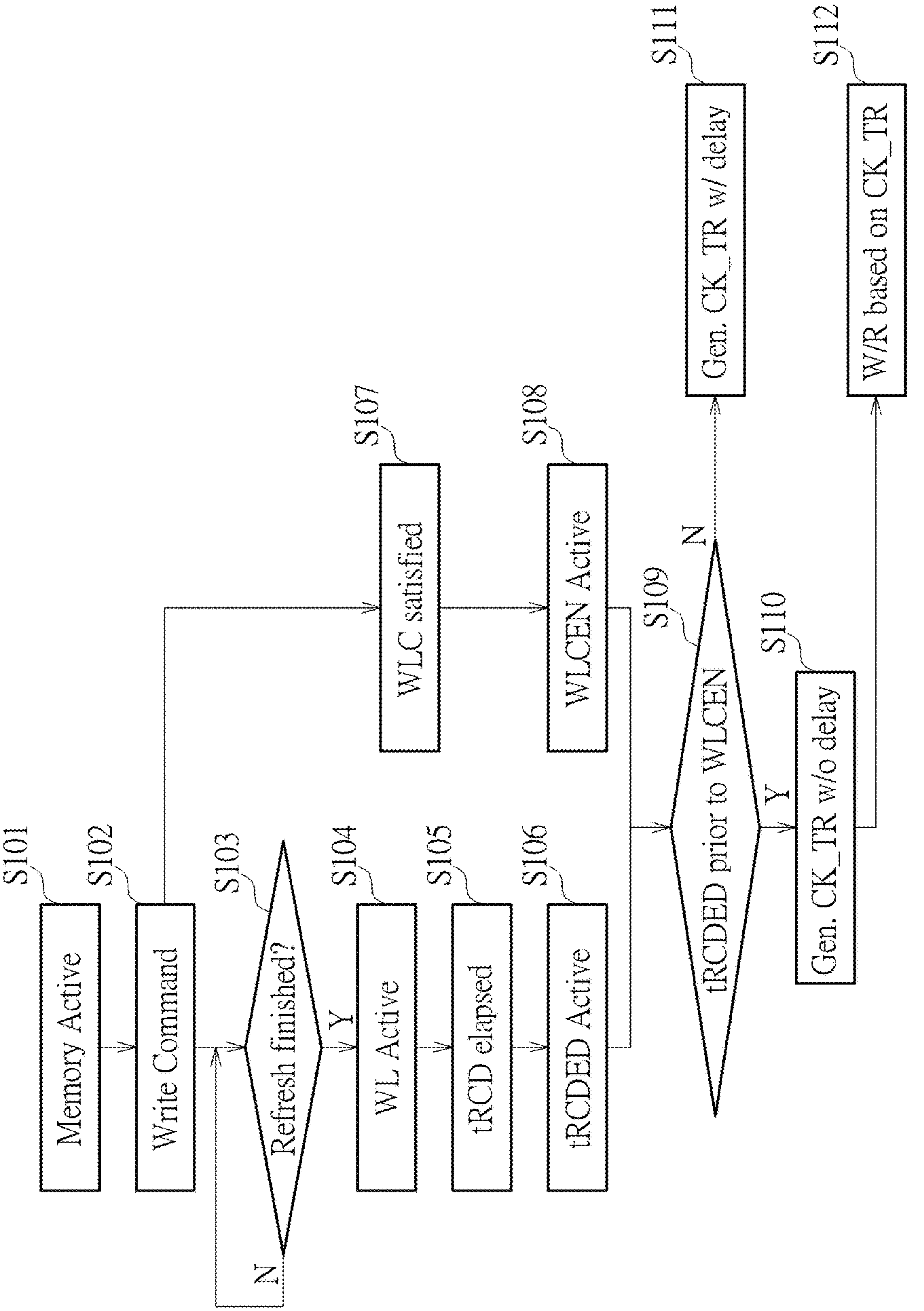
FIG. 8 illustrates a flow chart of a timing control method according to one embodiment of the present invention.

FIG. 8 illustrates a flow chart of a timing control method according to one embodiment of the present invention. In step S101, the memory module 10 is set as being active by the external memory controller 50. This can be realized by de-asserting a chip select signal CS # (which is active low). In step S102, a write command is sent by the memory controller 50 and received by the memory module 10. In step S103, it is determined whether a self-refresh operation is performed within the memory module 10 and whether the self-refresh operation has been finished. If no self-refresh operation is currently being performed within the memory module 10, or if any previously initiated refresh operation within the memory module 10 has already been finished, the flow advances to step S104. Conversely, if the self-refresh operation on within the memory module 10 is still ongoing, the flow remains at step S103. In step 104, a word line of the memory cell array 200 associated with the write command is activated by issuing a row activate command to the memory cell array 200 according to a row address associated with the write command.

In step S105, the flow waits for the row-to-column delay tRCD to elapse. Specifically, the timing of the row-to-column delay tRCD must commence only after the completion of the previously initiated self-refresh operation (i.e., after issuing the row activate command). In step S106, a row-to-column delay end indication signal TRCDED is set as active if the row-to-column delay tRCD has elapsed. On the other hand, the flow also advances to step S107 after step S102. In step S107, the flow waits for a write latency count WLC to be satisfied. Specifically, the counting of the write latency count WLC commence upon receiving the write command from the external memory controller 50. In step S108, a write latency count satisfaction indication signal WLCEN is set as active if the write latency count WLC has been satisfied.

Once the row-to-column delay end indication signal TRCDED and the write latency count satisfaction indication signal WLCEN are both set active, the flow proceeds to step S109. In step S109, it is determined whether the active state of the row-to-column delay end indication signal TRCDED is prior to the active state of the write latency count satisfaction indication signal WLCEN. If yes, the flow advances to step S110, in which the version CK_D<0> of the external clock signal CK without delay is selected as to generate the tracking clock signal CK_TR (by extracting its 5th-8th clock cycles of the version CK_D<0>).

On the other hand, if the active state of the row-to-column delay end indication signal TRCDED is not prior to the active state of the write latency count satisfaction indication signal WLCEN, the flow advances to step S111. In step S111, the tracking clock signal CK_TR will be generated by firstly selecting a delayed version of the external clock signal CK whose rising edge is closet to the active transition of the row-to-column delay end indication signal TRCDED than any other delayed versions of the external clock signal CK. Then, the tracking clock signal CK_TR is generated by extracting specific clock pulses of the selected delayed version of the external clock signal CK, starting from nth clock pulse of the selected delayed version of the external clock signal CK (where "n" is associated with the cycle number of the write latency count WLC). In step 112, a write operation will be performed on the memory cell array 200 according to the tracking clock signal CK_TR and an output data signal on the data bus GIO whose timing is determined by the tracking clock signal CK_TR.

While the foregoing descriptions of the embodiments of the present invention have been provided with examples primarily focused on performing write operations in response external write command, it should be understood that the invention is not limited to these examples. According to various embodiment of the present invention, the timing control circuit and method can be also applied to handling read commands. During handling a read command, the tracking clock signal CK_TR would be used to generate necessary column selection signals, thereby correctly read data from the memory cell array 200 according to the timing of the tracking clock signal CK_TR.

In conclusion, the timing control circuit and method of the present invention effectively address the issues caused by refresh collision (i.e., an internal refresh operation is being performed when receiving an external access command) or improper the write latency count setting (i.e., being set to short) by providing a tracking clock signal and an output data signal that is aligned with tracking clock signal in time to facilitating handling of the access commands. Compared to the conventional art, the read/write operation within the present invention does not rely on an external clock signal, which allows the read/write operation to be properly performed on the memory cell array even if the external memory controller cease to provide the external clock signal.

Embodiments in accordance with the present embodiments can be implemented as an apparatus, method, or computer program product. Accordingly, the present embodiments may take the form of an entirely hardware embodiment, an entirely software embodiment, or an embodiment combining software and hardware aspects that can all generally be referred to herein as a "module" or "system." Furthermore, the present embodiments may take the form of a computer program product embodied in any tangible medium of expression having computer-usable program code embodied in the medium. In terms of hardware, the present invention can be accomplished by applying any of the following technologies or related combinations: an individual operation logic with logic gates capable of performing logic functions according to data signals, and an application specific integrated circuit (ASIC), a programmable gate array (PGA) or a field programmable gate array (FPGA) with a suitable combinational logic.

The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It is also noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions. These computer program instructions can be stored in a computer-readable medium that directs a computer or other programmable data processing apparatus to function in a particular manner, such that the instructions stored in the computer-readable medium produce an article of manufacture including instruction means which implement the function/act specified in the flowchart and/or block diagram block or blocks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A timing control circuit for use in a memory module, comprising:

a clock generation circuit, configured to generate one or more delayed versions of an external clock signal, and select one of the external clock signal and the one or more delayed versions of the external clock signal to generate a tracking clock signal according to a write latency count satisfaction indication signal and a row-to-column delay end indication signal; and a data queue, coupled to the clock generation circuit, configured to queue input data according to the external clock signal and generate an output data signal by de-queuing the queued input data according to the tracking clock signal;

wherein the output data signal and the tracking clock signal are utilized to perform a write operation within the memory module in response to an external write command.

2. The timing control circuit of claim 1, wherein the clock generation circuit is configured to:

select the external clock signal to generate the tracking clock signal if an active state of the write latency count satisfaction indication signal is after an active state of the row-to-column delay end indication signal; and select one of the one or more delayed versions of the external clock signal to generate the tracking clock signal if the active state of the write latency count satisfaction indication signal is prior to the active state of the row-to-column delay end indication signal.

3. The timing control circuit of claim 2, wherein the clock generation circuit is configured to select one of the one or more delayed versions of the external clock signal by comparing timings of the active state of the row-to-column delay end indication signal with each of the one or more delayed versions of the external clock signal.

4. The timing control circuit of claim 3, wherein the clock generation circuit is configured to select one of the one or more delayed versions of the external clock signal whose rising edge occurs immediately after an active transition of the row-to-column delay end indication signal, compared to any other delayed versions of the external clock signal.

5. The timing control circuit of claim 4, wherein the clock generation circuit is configured to generate the tracking clock signal by extracting a specific number of clock pulses of the selected delayed version of the external clock signal, starting at a nth pulse clock thereof; and the nth clock pulse is associated with a cycle number corresponding to a write latency count.

6. The timing control circuit of claim 1, wherein the clock generation circuit is configured to generate the one or more delayed versions of the external clock signal by adding one or more predetermined amounts of delays to the external clock signal.

7. The timing control circuit of claim 1, wherein the tracking clock signal is further utilized for generating one or more column selection signals, thereby activating one or more columns of a memory cell array of the memory module according to a timing of the tracking clock signal.

8. The timing control circuit of claim 1, wherein the write latency count satisfaction indication signal is set active when a write latency count has been satisfied, and the row-to-column delay end indication signal is set active when a row-to-column delay has elapsed.

9. The timing control circuit of claim 1, wherein the tracking clock signal is utilized to perform a read operation within the memory module in response to an external read command.

10. The timing control circuit of claim 1, wherein the memory module is a double data rate synchronous dynamic random-access memory (DDR SDRAM) module accessible through an asynchronous interface.

11. A memory module comprising the timing control circuit of claim 1.

12. A timing control method for use in a memory module, comprising:

generating one or more delayed versions of an external clock signal;

selecting one of the external clock signal and the one or more delayed versions of the external clock signal to generate a tracking clock signal according to a write latency count satisfaction indication signal and a row-to-column delay end indication signal;

queuing input data according to the external clock signal;

de-queuing the queued input data to generate an output data signal according to the tracking clock signal; and performing a write operation within the memory module in response to an external write command according to the output data signal and the tracking clock signal.

13. The timing control method of claim 12, wherein the step of selecting one of the external clock signal and the one or more delayed versions of the external clock signal comprises:

selecting the external clock signal to generate the tracking clock signal if an active state of the write latency count satisfaction indication signal is after an active state of the row-to-column delay end indication signal; and selecting one of the one or more delayed versions of the external clock signal to generate the tracking clock signal if the active state of the write latency count satisfaction indication signal is prior to the active state of the row-to-column delay end indication signal.

14. The timing control method of claim 13, wherein the step of selecting one of the one or more delayed versions of the external clock signal comprises:

selecting one of the one or more delayed versions of the external clock signal by comparing timings of the active state of the row-to-column delay end indication signal with each of the one or more delayed versions of the external clock signal.

15. The timing control method of claim 14, wherein the step of selecting one of the one or more delayed versions of the external clock signal comprises:

selecting one of the one or more delayed versions of the external clock signal whose rising edge occurs immediately after an active transition of the row-to-column delay end indication signal, compared to any other delayed versions of the external clock signal.

16. The timing control method of claim 15, wherein the step of generating the tracking clock signal comprises:

generating the tracking clock signal by extracting a specific number of clock pulses of the selected delayed version of the external clock signal, starting at a nth clock pulse thereof; and the nth clock pulse is associated with a cycle number corresponding to a write latency count.

17. The timing control method of claim 12, further comprising:

generating the one or more delayed versions of the external clock signal by adding one or more predetermined amounts of delays to the external clock signal.

18. The timing control method of claim 12, further comprising:

generating one or more column selection signals according to tracking clock signal, thereby activating one or more columns of a memory cell array of the memory module according to a timing of the tracking clock signal.

19. The timing control method of claim 12, further comprising:

setting the write latency count satisfaction indication signal active when a write latency count has been satisfied; and setting the row-to-column delay end indication signal active when a row-to-column delay has elapsed.

20. The timing control method of claim 12, further comprising:

performing a read operation within the memory module in response to an external read command according to the tracking clock signal.

21. The timing control method of claim 12, wherein the memory module is a double data rate synchronous dynamic random-access memory (DDR SDRAM) module accessible through an asynchronous interface.

* * * * *